(12) United States Patent
Huang (10) Patent No.: US 7,388,398 B1
(45) Date of Patent: Jun. 17, 2008

(54) INVERTER, NAND GATE, AND NOR GATE IRRELATIVE TO VOLTAGE, TEMPERATURE, AND PROCESS WITH AN ADJUSTABLE THRESHOLD

(75) Inventor: Hsien-Sheng Huang, Hsinchu (TW)

(73) Assignee: Etron Technology, Inc., Hsinchu (TW)

( * ) Notice: Subject to any disclaimer, the term of this patent is extended or adjusted under 35 U.S.C. 154(b) by 0 days.

(21) Appl. No.: 11/758,010

(22) Filed: Jun. 5, 2007

(30) Foreign Application Priority Data

Apr. 2, 2007 (TW) .............................. 96111675 A (51) Int. Cl.
*H03K 17/16* (2006.01)
(52) U.S. Cl. .............................. 326/32; 326/83; 326/26
(58) Field of Classification Search ................ 326/112, 326/119, 121, 26, 27, 83, 31, 32
See application file for complete search history.

(56) References Cited

U.S. PATENT DOCUMENTS

| 6,075,382 A * | 6/2000 | Tournier ....................... 326/83 |
| 6,529,058 B2 * | 3/2003 | Gupta .......................... 327/276 |
| 7,256,621 B2 * | 8/2007 | Lih et al. ..................... 326/121 |
| 7,268,595 B2 * | 9/2007 | Ajit ............................ 327/108 |

* cited by examiner

*Primary Examiner*—Don P Le
(74) *Attorney, Agent, or Firm*—Winston Hsu (57) ABSTRACT

An inverter with adjustable threshold and irrelative to voltage, temperature, and process is disclosed. The inverter includes an input end for receiving an input signal; an output end for outputting an inverted signal of the input signal; a first PMOS whose gate is coupled to the input end, drain is coupled to the output end, and the source is coupled to a power supply; a first NMOS whose gate is coupled to the input end, drain is coupled to the output end, and source is coupled to a ground end, and an adjustable current source coupled to the output end for providing current with adjustable size to the output end for adjusting threshold of the inverter.

18 Claims, 10 Drawing Sheets

INVERTER, NAND GATE, AND NOR GATE IRRELATIVE TO VOLTAGE, TEMPERATURE, AND PROCESS WITH AN ADJUSTABLE THRESHOLD

BACKGROUND OF THE INVENTION

1. Field of the Invention

The present invention relates to an inverter with adjustable threshold, and more particularly, to an inverter irrelative to voltage, temperature, and process with an adjustable threshold.

2. Description of the Prior Art

Figure 1:
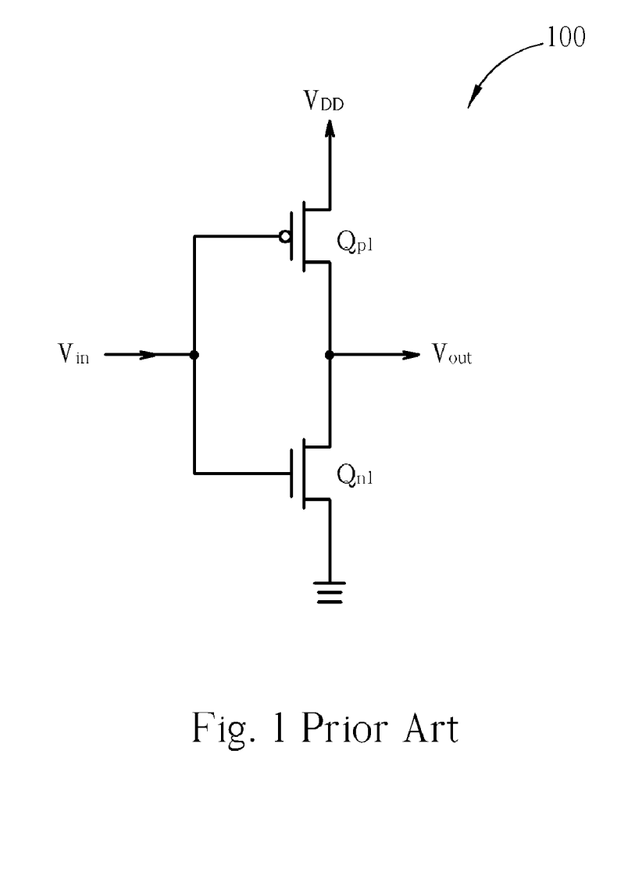
FIG. 1 is a diagram illustrating a conventional inverter.

Please refer to FIG. 1. FIG. 1 is a diagram illustrating a conventional inverter 100. As shown in FIG. 1, the inverter 100 comprises a N-type Metal Oxide Semiconductor (MOS) transistor Qn1, a P-type MOS transistor Qp1, an input end for receiving an input signal Vin, and an output end for outputting an output signal Vout. The source of the transistor Qp1 is coupled to a bias source VDD, the gate of the transistor Qp1 is coupled to the input end for receiving the input signal Vin, and the drain of the transistor Qp1 is coupled to the output end. The source of the transistor Qn1 is coupled to a ground end, the gate of the transistor Qn1 is coupled to the input end for receiving the input signal Vin, and the drain of the transistor Qn1 is coupled to the output end.

Figure 2:
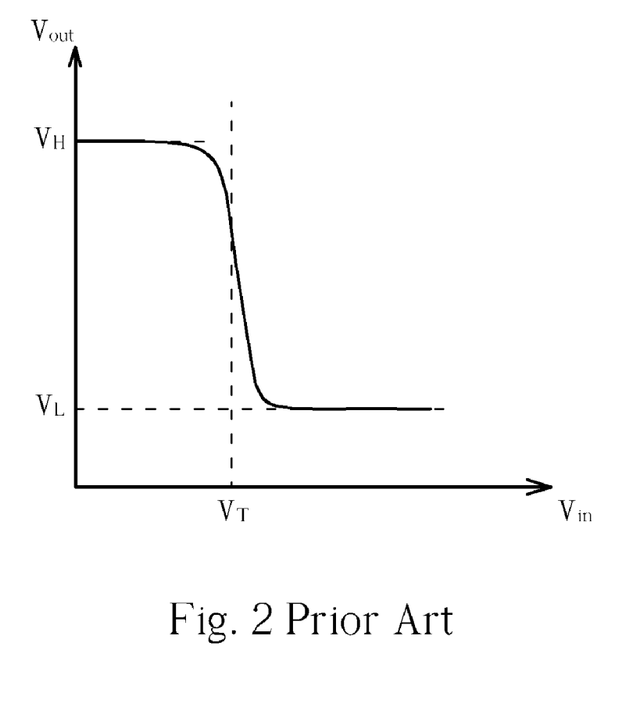
FIG. 2 is a diagram illustrating the input signal/output signal relation of inverter.

Please refer to FIG. 2. FIG. 2 is a diagram illustrating the input signal/output signal relation. As shown in FIG. 2, the threshold voltage is VT. When the input signal Vin is higher than the threshold VT, the output signal Vout is at a low voltage VL; when the input signal Vin is lower than the threshold VT, the output signal Vout is at a high voltage VH. For example, assume VH=5 volts, VL=0 volts, and VT=2.5 volts. Under such condition, when the input signal Vin exceeds 2.5 volts, the output signal Vout becomes 0 volts; when the input signal Vin is lower than 2.5 volts, the output signal Vout becomes 5 volts. In such manner, the input signal Vin is inverted and then output as the output signal Vout.

However, in general, the threshold is fixed. The ratio of the length/width of the PMOS and the NMOS transistors decides the threshold. Thus, if the user wants to operate the inverter with higher input voltage (such as 3~4 volts), since the threshold remains at 2.5 volts, the inverter does not work because in this way the input voltage is always higher than the threshold and the output voltage is always kept at 0 volts (the low voltage VL). On other hand, if the user wants to operate the inverter with lower input voltage (such as 1~2 volts), since the threshold remains at 2.5 volts, the inverter does not work because in this way the input voltage is always lower than the threshold and the output voltage is always kept at 5 volts (the high voltage VH). According to the reasons, the usage of the conventional inverter is limited.

Additionally, the threshold differs in inverters of different processes. In fact, even inverters of a same process have different thresholds: for example, PMOS transistors produced in the same process but in different batches do not necessarily output the same current under the same bias condition. Hence, the threshold of the conventional inverter is unpredictable, impacting performance.

SUMMARY OF THE INVENTION

The present invention provides an inverter irrelative to voltage, temperature, and process with an adjustable threshold. The inverter comprises an input end for receiving an input signal, an output end for outputting an inversion of the input signal; a first P-type Metal Oxide Semiconductor (MOS) transistor comprising a gate coupled to the input end, a drain coupled to the output end, and a source coupled to a bias source; a first N-type MOS transistor comprising a gate coupled to the input end a drain coupled to the output end, and a source coupled to a ground end, and an adjustable current source coupled to the output end for outputting current with adjustable size and for adjusting the threshold of the inverter.

The present invention further provides a NAND gate irrelative to voltage, temperature, and process with an adjustable threshold. The NAND gate comprises a first input end for receiving a first input signal, a second input end for receiving a second input signal, an output end for outputting a NAND-operated signal of the first and the second input signals; a first N-type MOS transistor comprising a gate coupled to the first input end, a drain, and a source coupled to a ground end; a second N-type MOS transistor comprising a gate coupled to the second input end, a drain coupled to the output end, and a source coupled to drain of the first N-type MOS transistor; a first P-type MOS transistor comprising a gate coupled to the first input end, a drain coupled to the output end, and a source coupled to a bias source; a second P-type MOS transistor comprising a gate coupled to the second input end, a drain coupled to the output end, and a source coupled to the bias source; and an adjustable current source coupled to the output end for outputting current with adjustable size and for adjusting the threshold of the NAND gate.

The present invention further provides a NOR gate irrelative to voltage, temperature, and process with an adjustable threshold. The NOR gate comprises a first input end for receiving a first input signal, a second input end for receiving a second input signal, an output end for outputting an NOR-operated signal of the first and the second input signals; a first N-type MOS transistor comprising a gate coupled to the first input end, a drain coupled to the output end, and a source coupled to a ground end; a second N-type MOS transistor comprising a gate coupled to the second input end, a drain coupled to the output end, and a source coupled to the ground end; a first P-type MOS transistor comprising a gate coupled to the first input end, a drain, and a source coupled to a bias source; a second P-type MOS transistor comprising a gate coupled to the second input end, a drain coupled to the output end, and a source coupled to the drain of the first P-type MOS transistor; and an adjustable current source coupled to the output end for outputting current with adjustable size and for adjusting the threshold of the NOR gate.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
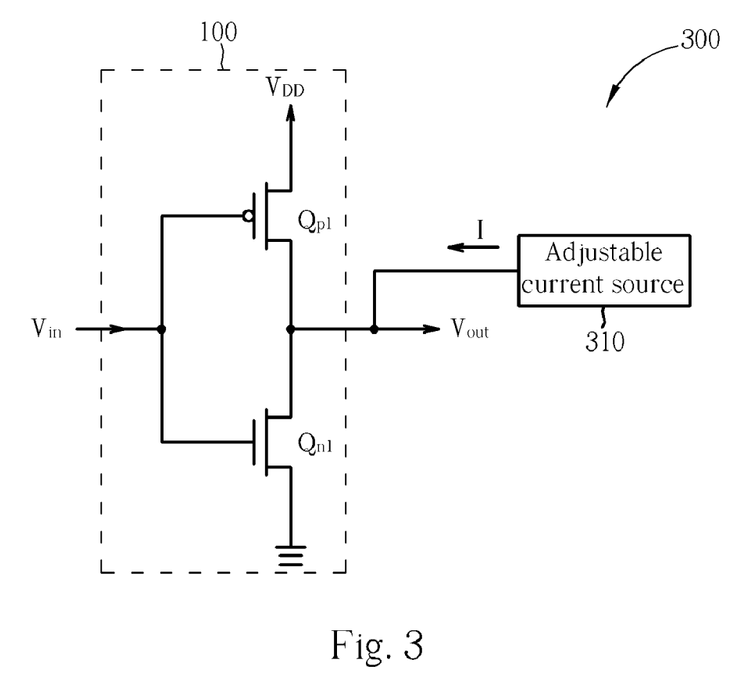
FIG. 3 is a diagram illustrating an inverter with adjustable threshold of the present invention.

Please refer to FIG. 3. FIG. 3 is a diagram illustrating an inverter 300 with adjustable threshold of the present invention. As shown in FIG. 3, the inverter 300 comprises an inverter 100 and an adjustable current source 310. The adjustable current source 310 provides a current I to the transistor Qp1 or the transistor Qn1 so as to change the threshold VT. For example, when the input signal Vin rises gradually from the low voltage to the high voltage, the current output from the transistor Qp1 decreases, and the current output from the transistor Qn1 increases. That is, the voltage of the output signal Vout falls gradually toward the low voltage VL. When the input signal Vin is higher than the threshold VT (assuming it is 2.5 volts), the current of the transistor Qp1 is smaller than that of the transistor Qn1, causing the output signal Vout is completely pulled down to the low voltage VL. Thus, the adjustable current source 310 provides the current I to the output end so as to raise the voltage of the output signal Vout. In this way, the voltage of the input signal Vin must rise higher to pull the output signal Vout down to the low voltage VL. Thus, the threshold of the inverter 300 is adjustable. Therefore, if the threshold of the inverter 100 is set at 2.5 volts and the bias voltage VDD is 5 volts, the inverter 300 can adjust the threshold of the inverter 300 to be 3.5 volts so that the input signal Vin operates at higher range (3~4 volts). By the same token, when the input signal Vin falls gradually from the high voltage to the low voltage, the current output from the transistor Qp1 increases, and the current output from the transistor Qn1 decreases. That is, the voltage of the output signal Vout rises gradually toward the high voltage VH. When the input signal Vin is lower than the threshold VT (assuming this is 2.5 volts), the current of the transistor Qn1 is smaller than that of the transistor Qp1, causing the output signal Vout to rise completely to the high voltage VH. Thus, the adjustable current source 310 provides the current I to the output end so as to pull the output signal voltage Vout up. In this way, the voltage of the input signal Vin has to fall lower in order to raise the output signal Vout up to the high voltage VH. Thus, the threshold of the inverter 300 is adjustable. Therefore, if the threshold of the inverter 100 is set at 2.5 volts and the bias voltage VDD is 5 volts, the inverter 300 can adjust the threshold of the inverter 300 to be 1.5 volts so that the input signal Vin operates at lower range (1~2 volts). The inverter 300 of the present invention utilizes the output current of the adjustable current source 310 to manipulate the threshold VT to meet users' needs.

Figure 4:
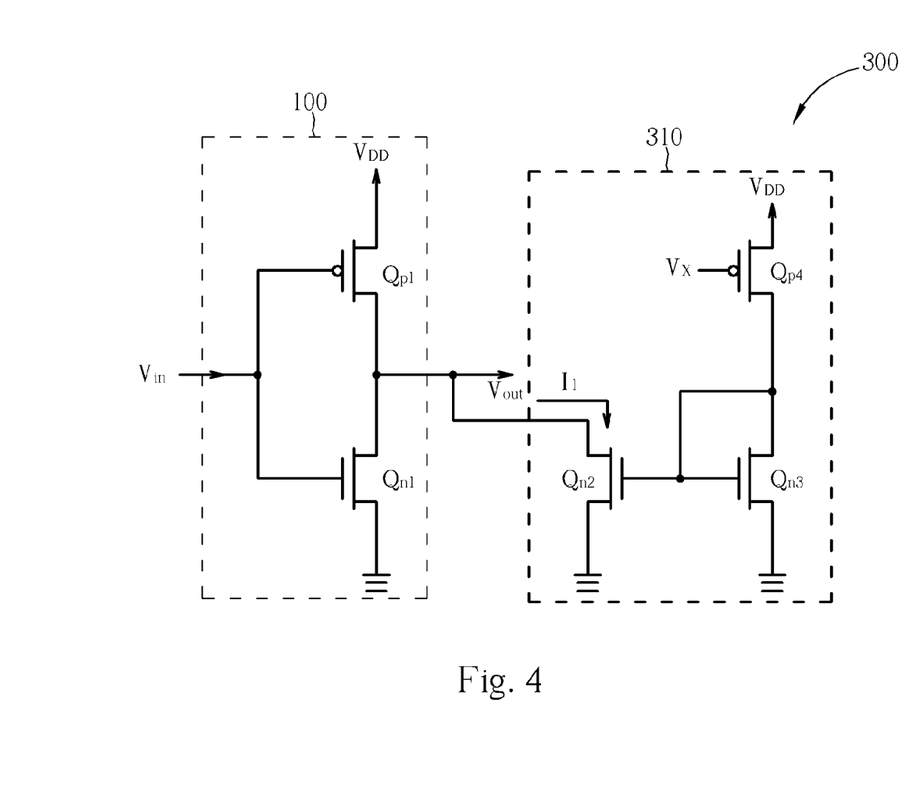
FIG. 4 is a diagram illustrating a first embodiment according to the adjustable current source of the inverter of the present invention.

Please refer to FIG. 4. FIG. 4 is a diagram illustrating a first embodiment according to the adjustable current source 310 of the inverter 300 of the present invention. As shown in FIG. 4, the adjustable current source 310 comprises two NMOS transistors Qn2, Qn3, and a PMOS transistor Qp4. The source of the PMOS transistor Qp4 is coupled to a bias source VDD, the gate of the PMOS transistor Qp4 is disposed for receiving a control voltage Vx, and the drain of the PMOS transistor Qp4 is coupled to the drain of the NMOS transistor Qn3. The gate of the NMOS transistor Qn3 is coupled to the drain of the PMOS transistor Qp4, the source of the NMOS transistor Qn3 is coupled to a ground end, and the drain of the NMOS transistor Qn3 is coupled to the drain of the PMOS transistor Qp4. The gate of the NMOS transistor Qn2 is coupled to the drain of the PMOS transistor Qp4, the source of the NMOS transistor Qn4 is coupled to a ground end, and the drain of the NMOS transistor Qn4 is coupled to the output end of the inverter 100. The coupling of the transistors Qn2 and Qn3 forms a current mirror for copying the current conducting through the transistor Qp4 and transmitting the copied current to the output end of the inverter 100. The control voltage Vx controls the current conducting through the transistor Qp4 so as to control the current transmitted from the adjustable current source 310 to the inverter 100 for adjusting the threshold. In this embodiment, the adjustable current source 310 outputs current for pulling down the output signals of the inverter 100, that is, for pulling down the threshold VT. Thus, this embodiment can be used to operate the input signal at a lower range. Besides changing the control voltage Vx to adjust current, the inverter 300 of the present invention can adjust the output current of the adjustable current source 310 and the threshold VT by changing the tunnel width and tunnel length of the transistor Qp4 and setting the control voltage Vx to be 0 volts. In realization, it is easier for users to couple the gate of the transistor Qp4 to the ground end and adjust the tunnel width/length of the transistor Qp4. Additionally, in this embodiment, since the conducting current of the MOS transistor is affected by not only the conducting voltage but also temperature, tunnel length, and tunnel width, the threshold of the conventional inverter 100 varies with the temperature, which may impact performance. In the inverter 300 of the present invention, the PMOS transistor Qp4 of the adjustable current source 310 is used to eliminate the effect of the temperature. Because the transistors Qp1 and Qp4 are produced in the same area, the transistor Qp1 has the same parameters as the transistor Qp4. That is, when the temperature rises, the conducting current of the transistor Qp1 rises, the conducting current of the transistor Qp4 also rises, and both conducting currents of the transistors Qp1 and Qp4 rise to the same degree. Therefore, the temperature effect is effectively eliminated. The temperature effect can also be eliminated by adjusting the tunnel length/width of the transistors Qp1 and Qp4. In detail, in the inverter 300, the tunnel length/width of the transistor Qp1 is proportional to the tunnel length/width of the transistor Qp4. In this way, when the temperature rises, the conducting current of the transistor Qp1 rises. Meanwhile, the conducting current of the transistor Qp4 rises as well (under the condition that the control voltage Vx is fixed) to the same degree. Thus, the temperature effect is eliminated. Therefore, the threshold VT of the inverter 300 does not change due to the temperature effect. Additionally, in real-world conditions, the bias source VDD may drift and the threshold of the conventional inverter 100 will be affected by a drift in the bias source VDD. In the inverter 300 of the present invention, because of the transistor Qp4, the drift effect of the bias source VDD is eliminated. More particularly, when the bias source VDD drifts, both conducting currents of the transistors Qp1 and Qp4 vary to the same degree. Thus, the effect of the varied conducting current of the transistor Qp1 onto the threshold VT is eliminated by the conducting current of the transistor Qp4. Additionally, as described above, transistors in different batches have slightly different relations between the conducting current and the bias source. Thus, the conventional inverter 100 is still affected by the process. In the inverter 300 of the present invention, since the transistors Qp4 and Qp1 are definitely produced in the same process and in the same batch, the drifting tendencies of the both transistors Qp1 and Qp4 must be same. The present invention uses such characteristics to eliminate the drifting of the process so that the threshold of the inverter 300 remains constant.

Figure 5:
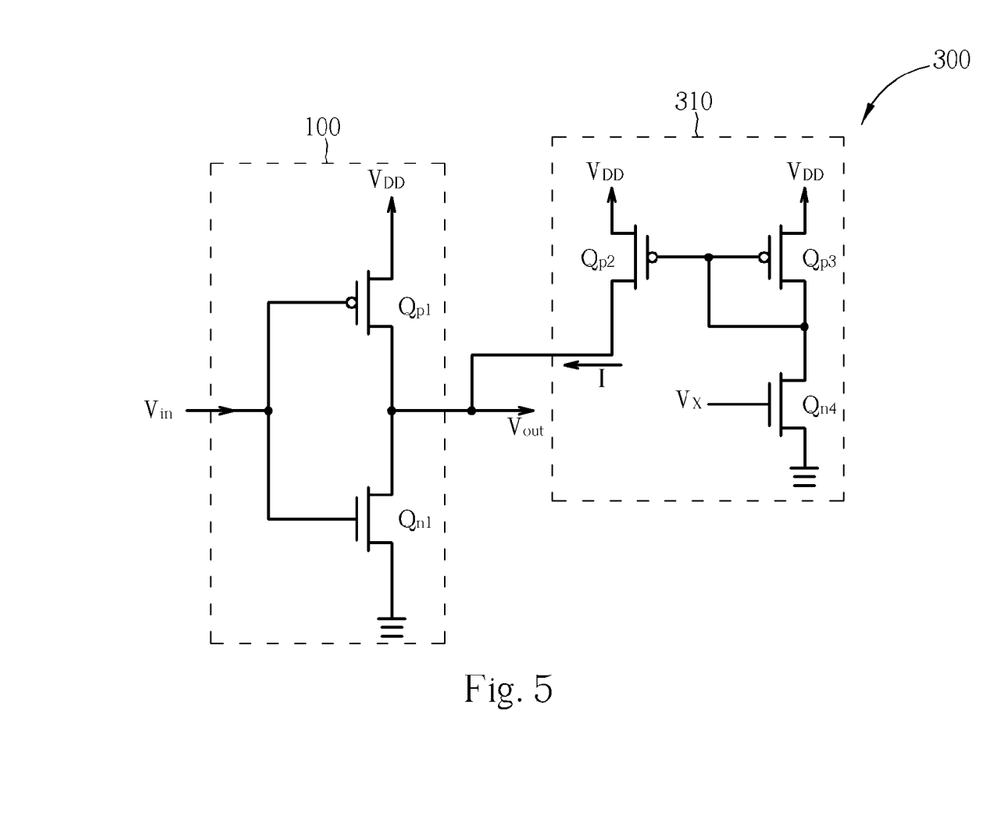
FIG. 5 is a diagram illustrating a second embodiment according to the adjustable current source of the inverter of the present invention.

Please refer to FIG. 5. FIG. 5 is a diagram illustrating a second embodiment according to the adjustable current source 310 of the inverter 300 of the present invention. As shown in FIG. 5, the adjustable current source 310 comprises two PMOS transistors Qp2 and Qp3, and a NMOS transistor Qn4. The source of the NMOS transistor Qn4 is coupled to a ground end, the gate of the NMOS transistor Qn4 is disposed for receiving a control voltage Vx, and the drain of the NMOS transistor Qn4 is coupled to the drain of the PMOS transistor Qp3. The gate of the PMOS transistor Qp3 is coupled to the drain of the NMOS transistor Qn4, the source of the PMOS transistor Qp3 is coupled to the bias source VDD, and the drain of the PMOS transistor Qp3 is coupled to the drain of the NMOS transistor Qn4. The gate of the PMOS transistor Qp2 is coupled to the drain of the NMOS transistor Qn4, the source of the PMOS transistor Qp2 is coupled to the bias source VDD, and the drain of the PMOS transistor Qp2 is coupled to the output end of the inverter 100. The coupling of the transistors Qp2 and Qp3 forms a current mirror for copying the conducting current of the transistor Qn4 and transmitting the copied current to the output end of the inverter 100. The control voltage Vx controls the conducting current of the transistor Qn4 so as to control the current transmitted from the adjustable current source 310 to the inverter 100 and the threshold VT. In this embodiment, the output current from the adjustable current source 310 raises the output signal of the inverter 100, that is, raises the threshold VT of the inverter 300. Thus, this embodiment can be used to operate the input signal Vin at a higher range. Besides changing the control voltage Vx to adjust current, the inverter 300 of the present invention can adjust the output current of the adjustable current source 310 and the threshold VT by changing the tunnel width and tunnel length of the transistor Qn4 and setting the control voltage Vx to the bias source VDD. In realization, it is easier for users to couple the gate of the transistor Qn4 to the bias source VDD and adjust the tunnel width/length of the transistor Qn4. Additionally, in this embodiment, since the conducting current of the MOS transistor is affected by not only the conducting voltage but also temperature, tunnel length, and tunnel width, the threshold of the conventional inverter 100 varies with the temperature, which may impact performance. In the inverter 300 of the present invention, the NMOS transistor Qn4 of the adjustable current source 310 is used to eliminate the effect of the temperature. Because the transistors Qn1 and Qn4 are produced in the same area, the transistor Qn1 has the same parameters as the transistor Qn4. That is, when the temperature rises, the conducting current of the transistor Qn1 rises, the conducting current of the transistor Qn4 also rises, and both conducting currents of the transistors Qn1 and Qn4 rise to the same degree. Therefore, the temperature effect is eliminated. The temperature effect can also be eliminated by adjusting the tunnel length/width of the transistors Qn1 and Qn4. In detail, in the inverter 300, the tunnel length/width of the transistor Qn1 is proportional to the tunnel length/width of the transistor Qn4. In this way, when the temperature rises, the conducting current of the transistor Qn1 rises. Meanwhile, the conducting current of the transistor Qn4 rises as well (under the condition that the control voltage Vx is fixed) for the same degree. Thus, the temperature effect is eliminated. Therefore, the threshold VT of the inverter 300 does not change due to the temperature effect. Additionally, in real-world conditions, the bias source VDD may drift and the threshold of the conventional inverter 100 will be affected by a drift in the bias source VDD. In the inverter 300 of the present invention, because of the transistor Qn4, the drift effect of the bias source VDD is eliminated. More particularly, when the bias source VDD drifts, both conducting currents of the transistors Qn1 and Qn4 vary to the same degree. Thus, the effect of the varied conducting current of the transistor Qn1 onto the threshold VT is eliminated by the conducting current of the transistor Qn4. Additionally, as described above, transistors in different batches have slightly different relations between the conducting current and the bias source. Thus, the conventional inverter 100 is still affected by the process. In the inverter 300 of the present invention, since the transistors Qn4 and Qn1 are definitely produced in the same process and in the same batch, the drifting tendencies of the both transistors Qn1 and Qn4 must be same. The present invention uses such characteristics to eliminate the drifting of the process so that the threshold of the inverter 300 remains constant.

Figure 6:
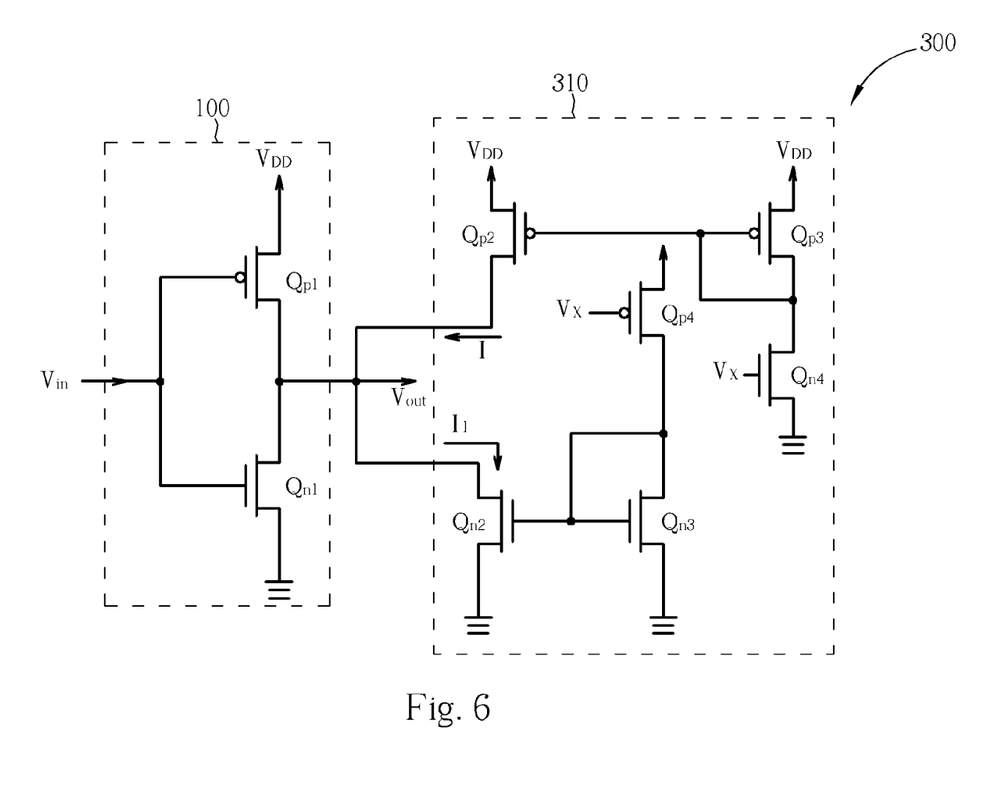
FIG. 6 is a diagram illustrating a third embodiment according to the adjustable current source of the inverter of the present invention.

Please refer to FIG. 6. FIG. 6 is a diagram illustrating a third embodiment according to the adjustable current source 310 of the inverter 300 of the present invention. As shown in FIG. 6, the third embodiment of the adjustable current source 310 can be composed of the first embodiment and the second embodiment of the adjustable current source of the present invention. The related description is the same as those of FIG. 4 and FIG. 5 and is omitted. Thus, the inverter 300 uses the adjustable current source in FIG. 6 to provide users with adjustable thresholds.

Figure 7:
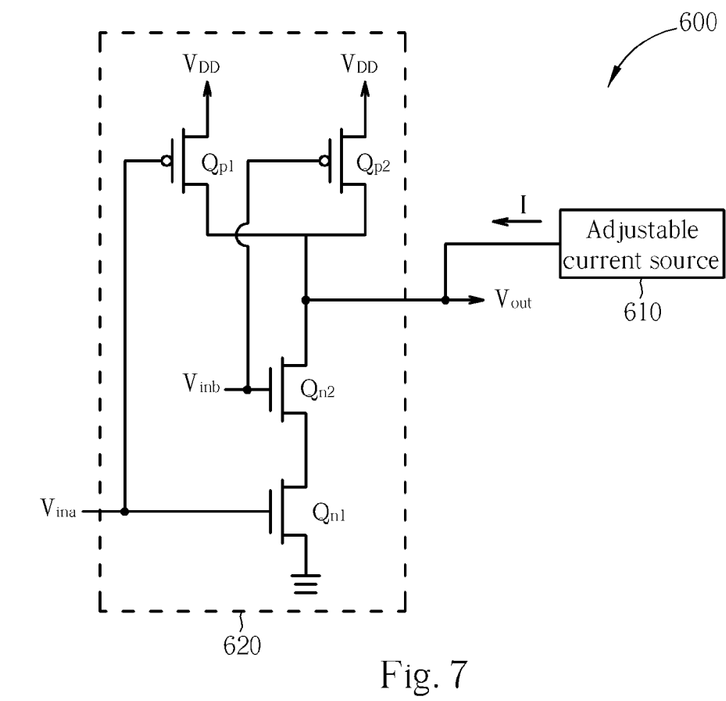
FIG. 7 is a diagram illustrating a NAND gate with adjustable threshold of the present invention.

Please refer to FIG. 7. FIG. 7 is a diagram illustrating a NAND gate with adjustable threshold of the present invention. As shown in FIG. 7, the NAND gate 600 comprises a NAND gate 620 and an adjustable current source 610. The NAND gate 620 comprises two NMOS transistors Qn1 and Qn2, and two PMOS transistors Qp1 and Qp2. The source of the transistor Qn1 is coupled to a ground end, the drain of the transistor Qn1 is coupled to the source of the transistor Qn2, and the gate of the transistor Qn1 is coupled to the first input end of the NAND gate 620 for receiving the input signal Vina. The source of the transistor Qn2 is coupled to the drain of the transistor Qn1, the drain of the transistor Qn2 is coupled to the output end of the NAND gate 620, and the gate of the transistor Qn2 is coupled to the second input end of the NAND gate 620 for receiving the input signal Vinb. The NAND gate 620 receives the input signals Vina and Vinb, executes a NAND calculation on the signals Vina and Vinb, and outputs the result at the output end of the NAND gate 620. The present invention adjusts the threshold of the NAND gate 600 by adding an adjustable current source 610 for providing a current I to the output end of the NAND gate 620 to change the threshold VT. Thus, the NAND gate 600 adjusts the threshold to meet users' need. To operate the input signals at a higher range, the NAND gate 600 raises the output current of the adjustable current source so as to raise the threshold: the higher the current of the adjustable current source, the higher the threshold.

Figure 8:
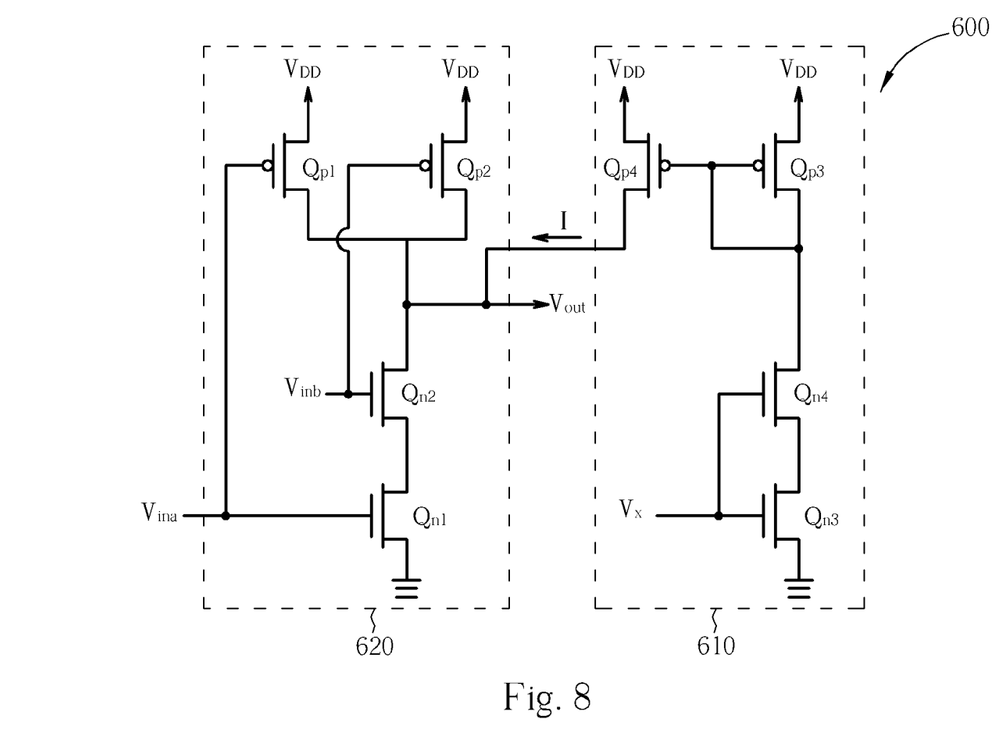
FIG. 8 is a diagram illustrating a first embodiment according to the adjustable current source of the NAND gate of the present invention.

Please refer to FIG. 8. FIG. 8 is a diagram illustrating a first embodiment according to the adjustable current source 610 of the NAND gate 600 of the present invention. As shown in FIG. 8, the adjustable current source 610 comprises two NMOS transistors Qn3 and Qn4, and two PMOS transistors Qp3 and Qp4. The source of the transistor Qp4 is coupled to the bias source VDD, the gate of the transistor Qp4 is coupled to the gate of the transistor Qp3, and the drain of the transistor Qp4 is coupled to the output end of the NAND gate 620. The source of the transistor Qp3 is coupled to the bias source VDD, the gate of the transistor Qp3 is coupled to the drain of the transistor Qn4, and the drain of the transistor Qp3 is coupled to the drain of the transistor Qn4. The source of the transistor Qn4 is coupled to the drain of the transistor Qn3, the gate of the transistor Qn4 is disposed for receiving a control voltage Vx, and the drain of the transistor Qn4 is coupled to the drain of the transistor Qp3. The source of the transistor Qn3 is coupled to a ground end, the gate of the transistor Qn3 is disposed for receiving the control voltage Vx, and the drain of the transistor Qn3 is coupled to the source of the transistor Qn4. The coupling of the transistors Qp3 and Qp4 forms a current mirror for copying the conducting current of the transistors Qp3 and Qn4 and transmitting the copied current to the output end of the NAND gate 620. The control voltage Vx controls the conducting current of the transistors Qn3 and Qn4 so as to control the current from the adjustable current source 610 to the NAND gate 620 and the threshold VT. In this embodiment, the current output from the adjustable current source 610 raises the output signals of the NAND gate 620; that is, it raises the threshold VT. Thus, to operate the input signal Vin in a higher range, this embodiment can be used to raise the threshold. Besides changing the control voltage Vx to adjust current, the NAND gate 600 of the present invention adjusts the output current of the adjustable current source 610 and the threshold VT by changing the tunnel width and tunnel length of the transistors Qn3 and Qn4 and setting the control voltage Vx to the bias source VDD. In realization, it is easier for users to couple the gates of the transistors Qn3 and Qn4 to the bias source VDD and adjust the tunnel width/length of the transistors Qn3 and Qn4. Additionally, in this embodiment, since the conducting current of the MOS transistor is affected by not only the conducting voltage but also temperature, tunnel length, and tunnel width, the threshold of the conventional NAND gate 620 varies with the temperature, which may impact performance. In the NAND gate 600 of the present invention, the NMOS transistors Qn3 and Qn4 of the adjustable current source 610 are used to eliminate the effect of the temperature. That is, when the temperature rises, the conducting current of the transistors Qn1 and Qn2 rise, the conducting current of the transistors Qn3 and Qn4 rise as well, and because the copied current I rises in tandem, the conducting current of the transistors Qn3 and Qn4 rise to the same degree. Therefore, the temperature effect is effectively eliminated. Additionally, in real-world conditions, the bias source VDD may drift. In the NAND gate 600 of the present invention, because of the transistors Qn3 and Qn4, the drift effect of the bias source VDD is eliminated. Thus, the threshold remains constant. Additionally, as described above, transistors in different batches have slightly different relations between the conducting current and the bias source. In the NAND gate 600 of the present invention, since the transistors Qn3 and Qn4, and Qn1 and Qn2 are definitely produced in the same process and in the same batch, the drifting tendencies must be the same. The present invention uses such characteristics to eliminate the drifting of the process so that the threshold of the NAND gate 600 remains constant.

Figure 9:
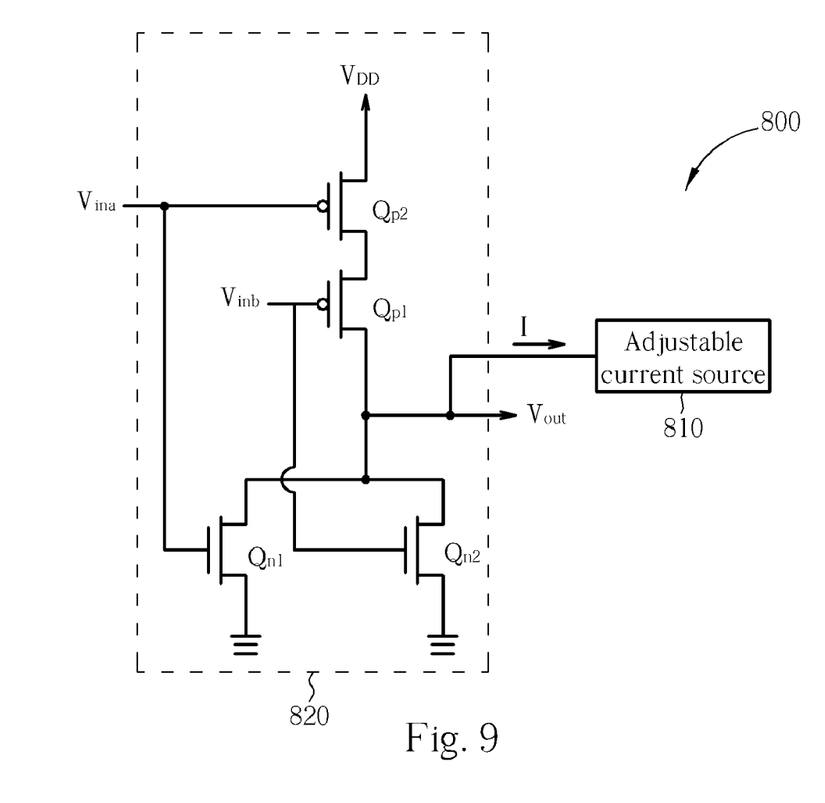
FIG. 9 is a diagram illustrating a NOR gate with adjustable threshold of the present invention.

Please refer to FIG. 9. FIG. 9 is a diagram illustrating a NOR gate 800 with adjustable threshold of the present invention. As shown in FIG. 9, the NOR gate 800 comprises a NOR gate 820 and an adjustable current source 810. The NOR gate 820 comprises two NMOS transistors Qn1 and Qn2, and two PMOS transistors Qp1 and Qp2. The source of the transistor Qn1 is coupled to a ground end, the drain of the transistor Qn1 is coupled to the output end of the NOR gate 820, and the gate of the transistor Qn1 is coupled to the first input end of the NAND gate 620 for receiving the input signal Vina. The source of the transistor Qn2 is coupled to the ground end, the drain of the transistor Qn2 is coupled to the output end of the NOR gate 820, and the gate of the transistor Qn2 is coupled to the second input end of the NOR gate 820 for receiving the input signal Vinb. The source of the transistor Qp1 is coupled to the drain of the transistor Qp2, the drain of the transistor Qp1 is coupled to the output end of the NOR gate 820, and the gate of the transistor Qp1 is coupled to the second input end of the NOR gate 820 for receiving the input signal Vinb. The source of the transistor Qp2 is coupled to the bias source VDD, the drain of the transistor Qp2 is coupled to the source of the transistor Qp1, and the gate of the transistor Qp2 is coupled to the first input end of the NOR gate 820 for receiving the input signal Vina. The NOR gate 820 receives the input signals Vina and Vinb, executes a NOR calculation on the signals Vina and Vinb, and outputs the result at the output end of the NOR gate 820. The present invention adjusts the threshold of the NOR gate 800 by adding an adjustable current source 810 to provide a current I to the output end of the NOR gate 820 to change the threshold VT. Thus, the NOR gate 800 adjusts the threshold to meet the users' needs. To operate the input signals in a higher range, the NOR gate 800 raises the output current of the adjustable current source so as to raise the threshold: the higher the current of the adjustable current source, the higher the threshold.

Figure 10:
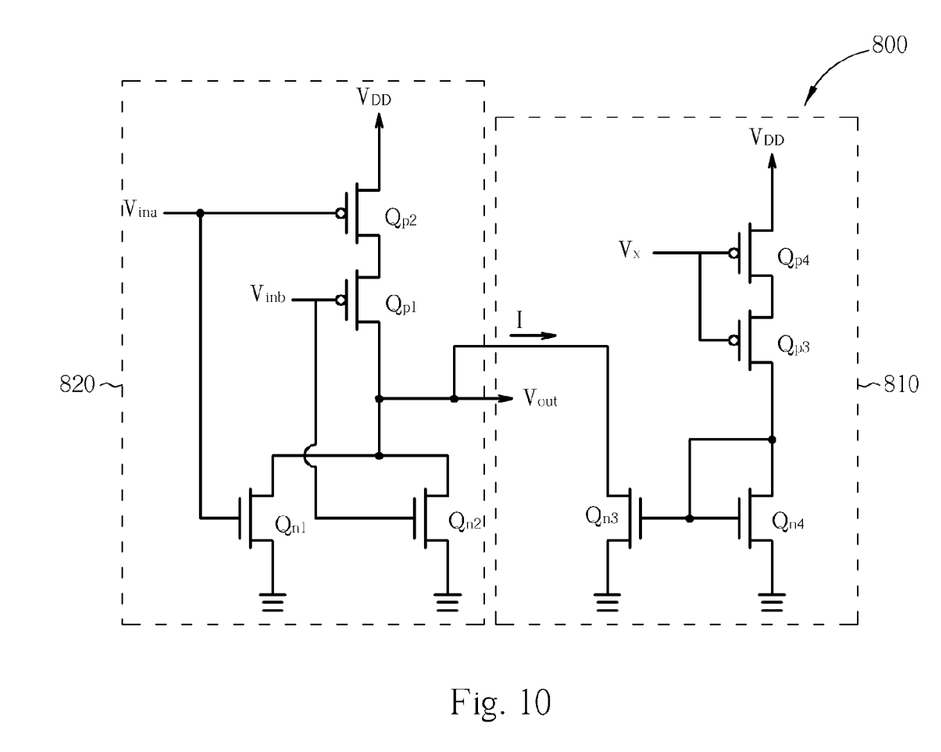
FIG. 10 is a diagram illustrating a first embodiment according to the adjustable current source of the NOR gate of the present invention.

Please refer to FIG. 10. FIG. 10 is a diagram illustrating a first embodiment according to the adjustable current source 810 of the NOR gate 800 of the present invention. As shown in FIG. 10, the adjustable current source 810 comprises two NMOS transistors Qn3 and Qn4, and two PMOS transistors Qp3 and Qp4. The source of the transistor Qp4 is coupled to the bias source VDD, the gate of the transistor Qp4 is disposed for receiving a control voltage Vx, and the drain of the transistor Qp4 is coupled to the source of the transistor Qp3. The source of the transistor Qp3 is coupled to the drain of the transistor Qp4, the gate of the transistor Qp3 is disposed for receiving the control voltage Vx, and the drain of the transistor Qp3 is coupled to the drain of the transistor Qn4. The source of the transistor Qn4 is coupled to the ground end, the gate of the transistor Qn4 is coupled to the drain of the transistor Qp3, and the drain of the transistor Qn4 is coupled to the drain of the transistor Qp3. The source of the transistor Qn3 is coupled to the ground end, the gate of the transistor Qn3 is coupled to the drain of the transistor Qp3, and the drain of the transistor Qn3 is coupled to the output end of the NOR gate 820. The coupling of the transistors Qn3 and Qn4 forms a current mirror for copying the conducting current of the transistors Qp3 and Qp4 and transmitting the copied current to the output end of the NOR gate 820. The control voltage Vx controls the conducting current of the transistors Qp3 and Qp4 so as to control the current from the adjustable current source 810 to the NOR gate 820 and the threshold VT. In this embodiment, the current output from the adjustable current source 810 pulls the output signals of the NOR gate 820 down; that is, pulls the threshold VT down. Thus, to operate the input signal Vin at a lower range can be achieved by pulling the threshold down. Besides changing the control voltage Vx to adjust current, the NOR gate 800 of the present invention adjusts the output current of the adjustable current source 810 and the threshold VT by changing the tunnel width and tunnel length of the transistors Qp3 and Qp4 and setting the control voltage Vx to be 0 volts. In realization, it is easier for users to couple the gates of the transistors Qp3 and Qp4 to the ground end and adjust the tunnel width/length of the transistors Qp3 and Qp4. Additionally, in this embodiment, since the conducting current of the MOS transistor is affected by not only the conducting voltage but also temperature, tunnel length, and tunnel width, the threshold of the conventional NOR gate 820 varies with the temperature, which may impact performance. In the NOR gate 800 of the present invention, the PMOS transistors Qp3 and Qp4 of the adjustable current source 810 is used to eliminate the effect of the temperature. That is, when the temperature rises, the conducting current of the transistors Qp1 and Qp2 rise, the conducting current of the transistors Qp3 and Qp4 rise as well, and because the copied current I rises in tandem, the conducting current of the transistors Qp3 and Qp4 rise to the same degree. Therefore, the temperature effect is effectively eliminated. Additionally, in real-world conditions, the bias source VDD may drift. In the NOR gate 800 of the present invention, because of the transistors Qp3 and Qp4, the drift effect of the bias source VDD is eliminated. Thus, the threshold remains constant. Additionally, as described above, transistors in different batches have slightly different relations between the conducting current and the bias source. In the NOR gate 800 of the present invention, since the transistors Qp3 and Qp4, Qp1 and Qp2 are definitely produced in the same process and in the same batch, the drifting tendencies must be the same. The present invention uses such characteristics to eliminate the drifting of the process so that the threshold of the NOR gate 800 remains constant.

To sum up, the present invention effectively adjusts the threshold, resists effect of the temperature, bias voltage drifting, and process variances, which improves performance and functionality.

Those skilled in the art will readily observe that numerous modifications and alterations of the device and method may be made while retaining the teachings of the invention.

What is claimed is:

1. An inverter irrelative to voltage, temperature, and process with an adjustable threshold, the inverter comprising:
   an input end for receiving an input signal;
   an output end for outputting an inverted signal of the input signal;
   a first P-type Metal Oxide Semiconductor (MOS) transistor comprising:
      a gate coupled to the input end;
      a drain coupled to the output end; and
      a source coupled to a bias source;
   a first N-type MOS transistor comprising:
      a gate coupled to the input end;
      a drain coupled to the output end; and
      a source coupled to a ground end; and
   an adjustable current source coupled to the output end for outputting current with adjustable size and adjusting the threshold of the inverter, the adjustable current source comprising:
      an auxiliary MOS transistor comprising a gate coupled to a controllable voltage source for outputting a first current according to a voltage outputted from the controllable voltage source; and
      a current mirror coupled between the auxiliary MOS transistor and the output end for outputting a second current to the output end according to the first current.

2. The inverter of claim 1 wherein the current mirror comprises:
   a second N-type MOS transistor comprising:
      a gate;
      a drain coupled to the output end; and
      a source coupled to the ground end; and
   a third N-type MOS transistor comprising;
      a gate coupled to the gate of the second N-type MOS transistor;
      a drain coupled to the gate of the second N-type MOS transistor; and
      a source coupled to the ground end.

3. The inverter of claim 2 wherein the auxiliary MOS transistor is a P-type MOS transistor comprising:
   a drain coupled to the gate of the second N-type MOS transistor;
   a source coupled to the bias source; and
   a gate coupled to the controllable voltage source.

4. The inverter of claim 1 wherein the current mirror comprises:
   a second P-type MOS transistor comprising:
      a gate;
      a drain coupled to the output end; and
      a source coupled to the bias source; and
   a third P-type MOS transistor comprising;
      a gate coupled to the gate of the second P-type MOS transistor;
      a drain coupled to the gate of the second P-type MOS transistor; and
      a source coupled to the bias source.

5. The inverter of claim 4 wherein the auxiliary MOS transistor is an N-type MOS transistor comprising:
   a drain coupled to the gate of the second P-type MOS transistor;
   a source coupled to the ground end; and
   a gate coupled to the controllable voltage source.

6. An inverter irrelative to voltage, temperature, and process with an adjustable threshold, the inverter comprising:
   an input end for receiving an input signal;
   an output end for outputting an inverted signal of the input signal;
   a first P-type MOS transistor comprising:
      a gate coupled to the input end;
      a drain coupled to the output end; and
      a source coupled to a bias source;
   a first N-type MOS transistor comprising:
      a gate coupled to the input end;
      a drain coupled to the output end; and
      a source coupled to a ground end; and
   an adjustable current source coupled to the output end for outputting current with adjustable size and adjusting the threshold of the inverter, the adjustable current source comprising:
      a first auxiliary MOS transistor comprising a gate coupled to a first controllable voltage source for outputting a first current according to a first control voltage output from the controllable voltage source;
      a second auxiliary MOS transistor comprising a gate coupled to a second controllable voltage source for outputting a second current according to a second control voltage output from the controllable voltage source;
      a first current mirror for outputting a third current to the output end according to the first current; and
      a second current mirror for outputting a fourth current to the output end according to the second current.

7. The inverter of claim 6 wherein the first current mirror comprises:
   a second N-type MOS transistor comprising:
      a gate;
      a drain coupled to the output end; and
      a source coupled to the ground end; and
   a third N-type MOS transistor comprising;
      a gate coupled to the gate of the second N-type MOS transistor;

a drain coupled to the gate of the second N-type MOS transistor; and a source coupled to the ground end.

8. The inverter of claim 7 wherein the first auxiliary MOS transistor is a P-type MOS transistor comprising:

a drain coupled to the gate of the second N-type MOS transistor;

a source coupled to the bias source; and a gate coupled to the first controllable voltage source.

9. The inverter of claim 6 wherein the second current mirror comprises:

a third P-type MOS transistor comprising:
a gate;
a drain coupled to the output end; and
a source coupled to the bias source; and a fourth P-type MOS transistor comprising;
a gate coupled to the gate of the third P-type MOS transistor;
a drain coupled to the gate of the third P-type MOS transistor; and
a source coupled to the bias source.

10. The inverter of claim 9 wherein the second auxiliary MOS transistor is an N-type MOS transistor comprising:

a drain coupled to the gate of the third P-type MOS transistor;

a source coupled to the ground end; and a gate coupled to the second controllable voltage source.

11. A NAND gate irrelative to voltage, temperature, and process with an adjustable threshold, the NAND gate comprising:

a first input end for receiving a first input signal;

a second input end for receiving a second input signal;

an output end for outputting a NAND-operated signal of the first and the second input signals;

a first N-type MOS transistor comprising:
a gate coupled to the first input end;
a drain; and
a source coupled to a ground end;

a second N-type MOS transistor comprising:
a gate coupled to the second input end;
a drain coupled to the output end; and
a source coupled to drain of the first N-type MOS transistor;

a first P-type MOS transistor comprising:
a gate coupled to the first input end;
a drain coupled to the output end; and
a source coupled to a bias source;

a second P-type MOS transistor comprising:
a gate coupled to the second input end;
a drain coupled to the output end; and
a source coupled to the bias source; and an adjustable current source coupled to the output end for outputting current with adjustable size and adjusting the threshold of the NAND gate.

12. The NAND gate of claim 11 wherein the adjustable current source comprises:

an auxiliary MOS transistor pair coupled to a controllable voltage source for outputting a first current according to a voltage outputted from the controllable voltage source, the auxiliary MOS transistor pair comprising:

a first auxiliary MOS transistor comprising:
a source coupled to the ground end;
a drain; and
a gate coupled to the controllable voltage source;

a second auxiliary MOS transistor comprising:
a source coupled to the drain of the first auxiliary MOS transistor; and
a gate coupled to the controllable voltage source;

a current mirror coupled between the drain of the second auxiliary MOS transistor and the output end for outputting a second current to the output end according to the first current.

13. The NAND gate of claim 12 wherein the current mirror comprises:

a third P-type MOS transistor comprising:
a gate;
a drain coupled to the output end; and
a source coupled to the bias source; and a fourth P-type MOS transistor comprising:
a gate coupled to the gate of the third P-type MOS transistor;
a drain coupled to the gate of the third P-type MOS transistor and the gate of the second auxiliary MOS transistor; and
a source coupled to the bias source.

14. The NAND gate of claim 13 wherein the first and the second auxiliary MOS transistors are N-type MOS transistors.

15. A NOR gate irrelative to voltage, temperature, and process with an adjustable threshold, the NOR gate comprising:

a first input end for receiving a first input signal;

a second input end for receiving a second input signal;

an output end for outputting a NOR-operated signal of the first and the second input signals;

a first N-type MOS transistor comprising:
a gate coupled to the first input end;
a drain coupled to the output end; and
a source coupled to a ground end;

a second N-type MOS transistor comprising:
a gate coupled to the second input end;
a drain coupled to the output end; and
a source coupled to the ground end;

a first P-type MOS transistor comprising:
a gate coupled to the first input end;
a drain; and
a source coupled to a bias source;

a second P-type MOS transistor comprising:
a gate coupled to the second input end;
a drain coupled to the output end; and
a source coupled to the drain of the first P-type MOS transistor; and an adjustable current source coupled to the output end for outputting current with adjustable size and adjusting the threshold of the NOR gate.

16. The NOR gate of claim 15 wherein the adjustable current source comprises:

an auxiliary MOS transistor pair coupled to a controllable voltage source for outputting a first current according to a voltage outputted from the controllable voltage source, the auxiliary MOS transistor pair comprising:

a first auxiliary MOS transistor comprising:
a source coupled to the bias source;
a drain; and
a gate coupled to the controllable voltage source;

a second auxiliary MOS transistor comprising:
    a source coupled to the drain of the first auxiliary MOS transistor; and
    a gate coupled to the controllable voltage source; and
a current mirror coupled between the drain of the second auxiliary MOS transistor and the output end for outputting a second current to the output end according to the first current.

17. The NOR gate of claim 16 wherein the current mirror comprises:
    a third N-type MOS transistor comprising:
        a gate;
        a drain coupled to the output end; and
        a source coupled to the ground end; and
    a fourth N-type MOS transistor comprising:
        a gate coupled to the gate of the third N-type MOS transistor;
        a drain coupled to the gate of the third N-type MOS transistor and the drain of the second auxiliary MOS transistor; and
        a source coupled to the ground end.

18. The NOR gate of claim 17 wherein the first and the second auxiliary MOS transistors are P-type MOS transistors.

* * * * *